(12) United States Patent
Fukuhisa

(10) Patent No.: US 7,924,185 B2
(45) Date of Patent: Apr. 12, 2011

(54) SEMICONDUCTOR INTEGRATED CIRCUIT DEVICE, PATTERN DETECTION METHOD AND SERIAL-PARALLEL CONVERSION METHOD

(75) Inventor: Hiroto Fukuhisa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 171 days.

(21) Appl. No.: 12/246,866

(22) Filed: Oct. 7, 2008

(65) Prior Publication Data

US 2009/0096644 A1 Apr. 16, 2009

(30) Foreign Application Priority Data

Oct. 10, 2007 (JP) ................................ 2007-264733

(51) Int. Cl.
*H03M 9/00* (2006.01)

(52) U.S. Cl. ...................................... 341/100; 341/101

(58) Field of Classification Search .................. 341/107, 341/100, 101; 375/114, 106, 111, 116, 354
See application file for complete search history.

(56) References Cited

U.S. PATENT DOCUMENTS

| | | | |
|---|---|---|---|
| 5,287,389 A * | 2/1994 | Ichibangase et al. | 375/365 |
| 6,265,996 B1 | 7/2001 | Duffy | |
| 6,459,393 B1 | 10/2002 | Nordman | |
| 6,999,543 B1 | 2/2006 | Trinh et al. | |
| 7,463,171 B2 * | 12/2008 | Baba | 341/100 |

* cited by examiner

*Primary Examiner* — Joseph Lauture
(74) *Attorney, Agent, or Firm* — Turocy & Watson, LLP

(57) ABSTRACT

A shift register SR configured to successively take in and hold input serial data on the basis of a first clock signal, a pattern detection section configured to detect a predetermined pattern contained in the serial data taken in the shift resister and a second clock generation section configured to determine timing of output of the serial data held in the shift register on the basis of a result of this detection are provided to detect the desired pattern contained in the serial data in the course of transferring the serial data for conversion from the serial data to parallel data to the shift resister, and to determine timing of conversion to the parallel data on the basis of a result of this detection, thus reducing the latency and achieving an improvement in communication speed and a reduction in circuit area.

17 Claims, 5 Drawing Sheets

SEMICONDUCTOR INTEGRATED CIRCUIT DEVICE, PATTERN DETECTION METHOD AND SERIAL-PARALLEL CONVERSION METHOD

CROSS REFERENCE TO RELATED APPLICATION

This application is based upon and claims the benefit of priority from the prior Japanese Patent Application No. 2007-264733 filed on Oct. 10, 2007; the entire contents of which are incorporated herein by this reference.

BACKGROUND OF THE INVENTION

1. Field of the Invention

The present invention relates to a semiconductor integrated circuit device, a pattern detection method and a serial-parallel conversion method suitable for serial-parallel conversion in a high-speed interface circuit.

2. Description of the Related Art

In recent years, Serializer/Deserializers (SerDes) have been adopted as a high-speed serial interface for buses or the like of computers. A deserializer used in a SerDes has a circuit portion configured to convert serial data into parallel data and a circuit portion configured to detect a sync pattern in the converted parallel data and convert the parallel data into a desired form.

That is, in the deserializer, received serial data is successively transferred to and stored in a plurality of shift registers by using a high-speed clock signal. After a predetermined number of bits of the data have been stored in the shift registers, the data is transferred in parallel form from the shift registers by using a low-speed clock signal.

Subsequently, for synchronization, this parallel data is transferred to a circuit called a framer. The framer has a plurality of shift registers on a predetermined bit-by-bit basis, a plurality of sync pattern detection circuits and selecting circuits. From a plurality of parallel data items stored in the plurality of shift registers, a sync pattern is detected by the sync pattern detection circuits and a frame according to the position at which the sync pattern is detected is selected by the selecting circuits. In this way, parallel data synchronized with the sync pattern can be obtained from the selecting circuits. This system enables reception of transmitted data with reliability.

A serial/parallel conversion circuit of this kind is described in detail in Japanese Patent Application Laid-Open Publication No. 11-145944.

However, the framer operates by a low-speed clock signal and therefore has the drawback of increasing the latency and decreasing the performance. It is possible to reduce the latency by reducing the number of shift register stages in the framer. However, doing so necessitates drive of a comparatively large number of sync pattern detection circuits and selecting circuits and causes an increase in fan-out, resulting in a reduction in communication speed of the deserializer. Conversely, decreasing the fan-out in order to improve the communication speed of the deserializer causes an increase in latency, resulting in a considerable decrease in performance and increase in circuit area. Further, the framer requires a plurality of sync pattern detectors and selecting circuits and needs a comparatively large circuit area.

SUMMARY OF THE INVENTION

A semiconductor integrated circuit device according to one aspect of the present invention includes a shift register configured to successively take in and hold input serial data on the basis of a first clock signal, at least one pattern detection section configured to detect at least one predetermined pattern contained in the serial data taken in the shift register, and a timing determination section configured to, when the serial data held in the shift register is output by being converted into parallel data by using a second clock signal having a speed lower than that of the first clock signal, determine timing of conversion from the serial data to the parallel data on the basis of a result of detection performed by the at least one pattern detection section.

A pattern detection method according to another aspect of the present invention includes taking serial data in a shift register and successively transferring the serial data, dividing a predetermined pattern in the serial data into one or more first-group bits and second-group bits, determining, when one or more bits of the serial data corresponding to the one or more first-group bits are taken in the shift register, whether or not the serial data input to the shift register coincides with the one or more first-group bits by performing a logical operation on values of the bits taken in the shift register, and detecting, if it is determined by the logical operation that the serial data input to the shift register coincides with the one or more first-group bits, the predetermined pattern in the serial data, by making determination on a bit-by-bit basis, each time a bit of the serial data is taken in the shift register, as to whether or not the value of the bit taken in coincides with the corresponding one of the second-group bits of the predetermined pattern.

A serial-parallel conversion method according to still another aspect of the present invention includes taking serial data in a shift register and successively transferring the serial data by using a first clock signal, detecting a predetermined pattern contained in the serial data in the course of transfer of the serial data, and converting, when the predetermined pattern is detected, the serial data held in the shift register into parallel data by using a second clock signal having a speed lower than that of the first clock signal, and outputting the parallel data.

DETAILED DESCRIPTION OF THE PREFERRED EMBODIMENTS

Figure 1:
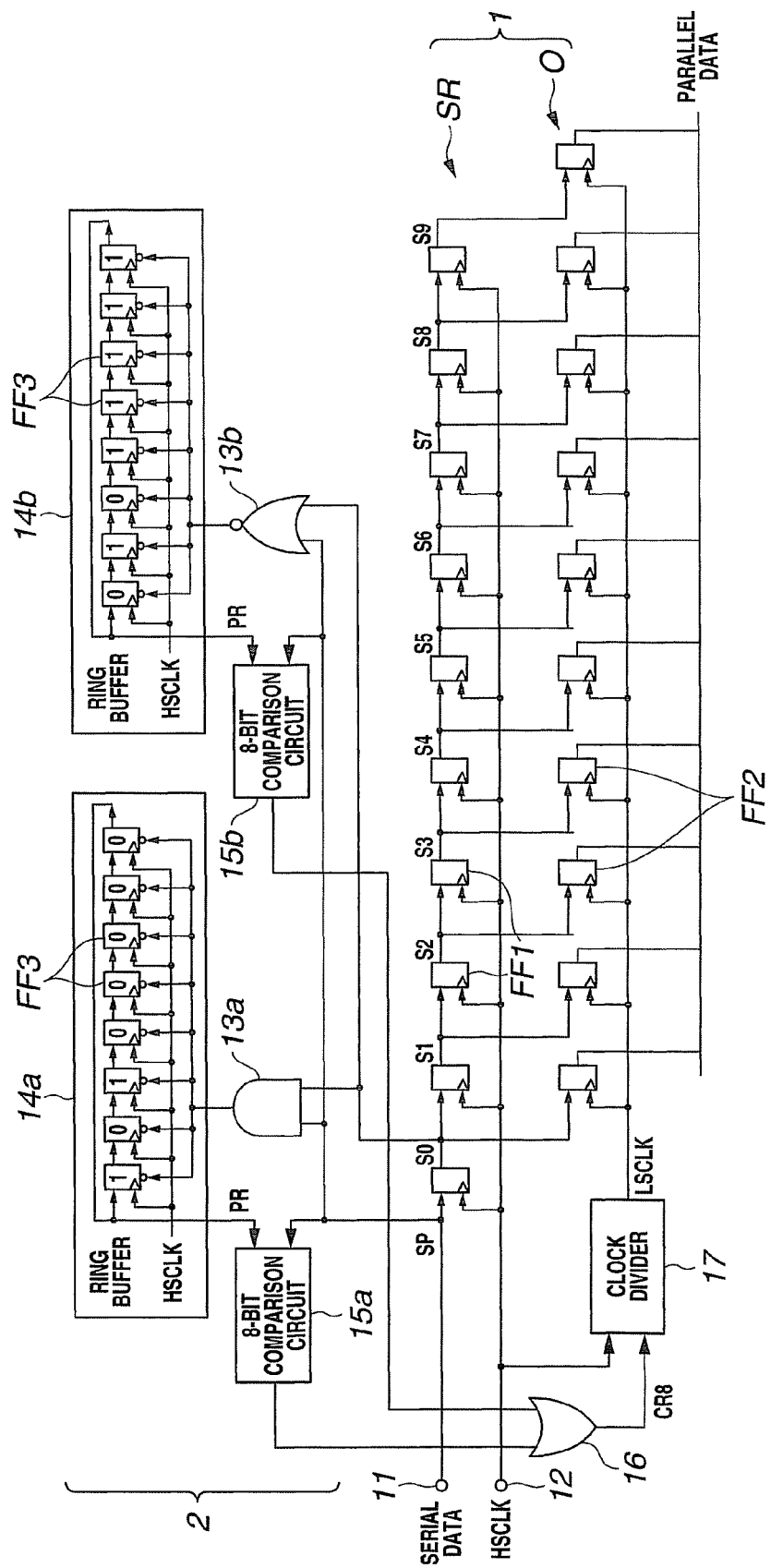
FIG. 1 is a circuit diagram showing a semiconductor integrated circuit device according to a first embodiment of the present invention.

FIG. 1 is a circuit diagram showing a semiconductor integrated circuit device according to a first embodiment of the present invention. The present embodiment is an example of an application of the present invention to a deserializer.

The deserializer shown in FIG. 1 is constituted by a serial-parallel conversion section 1 configured to convert input serial data into parallel data, and a pattern detection section 2 configured to detect a predetermined pattern. The serial-parallel conversion section 1 is constituted by a shift register SR and an output section O. The pattern detection section 2 is constituted by an AND circuit 13*a*, a NOR circuit 13*b*, ring buffers 14*a* and 14*b* and 8-bit comparison circuits 15*a* and 15*b*.

Serial data is input to an input terminal 11. A high-speed clock signal HSCLK is input to an input terminal 12. The serial data is supplied to the shift register SR constituting the serial-parallel conversion section 1 and to the AND circuit 13*a* and the NOR circuit 13*b* constituting the pattern detection section 2. The shift register SR is constituted by a plurality of flip-flops FF1 connected in series in a number of stages corresponding to the number of bits of parallel data into which the serial data is to be converted. In the example shown in FIG. 1, the shift register SR has flip-flops FF1 forming ten stages.

To a data terminal of each flip-flop FF1 of the shift register SR, an output from the flip-flop FF1 in the preceding stage is supplied, while the high-speed clock signal HSCLK is supplied to a clock terminal of the flip-flop FF1. Each flip-flop FF1 of the shift register SR takes in data supplied to its input terminal by an edge of the high-speed clock signal HSCLK and outputs the data to the subsequent stage. In this way, a sequence of bit values of the input serial data are output from the flip-flops FF1 of the shift registers SR.

The output from each flip clop FF1 of the shift register SR is also supplied to the output section O. The output section O has flip-flops FF2 forming a number of stages corresponding to the flip-flops FF1 of the shift register SR. Outputs from the flip-flops FF1 are respectively supplied to input terminals of the flip-flops FF2 of the output section O, and a low-speed clock signal LSCLK obtained by dividing the frequency of the high-speed clock signal HSCLK by 10 is supplied from a clock divider 17 described below to clock terminals of the flip-flops FF2. The flip-flops FF2 of the output section O simultaneously take in the bit values respectively input thereto by edges of the low-speed clock signal LSCLK and output the bit values as parallel data. In the example shown in FIG. 1, the output section O has flip-flops FF2 forming ten stages and can output 10 bits of data parallel to each other.

Timing of generation of edges of the low-speed clock signal LSCLK, i.e., timing of conversion from serial data to parallel data, is performed by detecting a sync pattern contained in the serial data. In the present embodiment, detection of a sync pattern is performed in the pattern detection section 2 while serial-parallel conversion is being performed in the serial-parallel conversion section 1.

Logic circuits formed of the AND circuit 13*a* and the NOR circuit 13*b* constituting the pattern detection section 2 are for simultaneously making comparisons of patterns having a predetermined number of consecutive bits in input serial data in parallel with each other. The example of the logic circuits shown in FIG. 1 corresponds to K28.5± patterns adopted as a sync pattern in the 8B10B code. The K28.5+ pattern is "1010000011" and the K28.5− pattern is "0101111100". That is, two bits first transmitted in transmission order in the K28.5+ pattern is "11", while two bits first transmitted in transmission order in the K28.5− pattern is "00".

To the AND circuit 13*a* and the NOR circuit 13*b*, serial data from the input terminal 11 and the output from the initial-stage flip-flop FF1 of the shift register SR are supplied. That is, the AND circuit 13*a* and the NOR circuit 13*b* are supplied with the values of consecutive two bits of serial data. When the first two bits of the K28.5+ pattern in transmission order are input to the AND circuit 13*a*, the AND circuit 13*a* outputs a logical value "1". When the first two bits of the K28.5− pattern in transmission order are input to the NOR circuit 13*b*, the NOR circuit 13*b* outputs a logical value "1". Accordingly, when the output from one of the AND circuit 13*a* and the NOR circuit 13*b* is "1", it is probable that input of the K28.5+ pattern or K28.5− pattern has been started.

In the present embodiment, pattern comparison of one to several bits in a predetermined pattern is made by the logic circuit, and comparison of the remaining bits is successively made by using the ring buffers 14*a* and 14*b*. The ring buffers 14*a* and 14*b* are identical in configuration to each other and are each constituted by flip-flops FF3 connected in series to form a plurality of stages. To an input terminal of each flip-flop FF3 in the ring buffers 14*a* and 14*b*, an output from the preceding stage is supplied. An output from the final-stage flip-flop FF3 is supplied to the input terminal of the initial-stage flip-flop FF3. The high-speed clock signal HSCLK is supplied to clock terminals of the ring buffers 14*a* and 14*b*, and data supplied to the input terminals of the ring buffers 14*a* and 14*b* are output from output terminals of the ring buffers 14*a* and 14*b* by the edges of the high-speed clock signal HSCLK. That is, the flip-flops FF3 of the ring buffers 14*a* and 14*b* circularly shift the data by the edges of the high-speed clock signal HSCLK.

In the ring buffers 14*a* and 14*b* in the present embodiment, the bit values other than those on which pattern comparison has been made by the logic circuits formed of the AND circuit 13*a* and the NOR circuit 13*b* in the patterns to be detected (K28.5± patterns) are set as initial values. An output from the AND circuit 13*a* or the NOR circuit 13*b* is supplied to clear terminals of the ring buffer 14*a* or 14*b* to reset the ring buffer 14*a* or 14*b* to the initial value. In FIG. 1, numeric values in the flip-flops FF3 denote the set bit values.

After receiving "1" through the clear terminals to be reset to the initial value, the ring buffer 14*a* or 14*b* successively outputs the values set therein from the one set in the final-stage flip-flop FF3 to the one set in the initial-stage flip-flop FF3 by the edges of the high-speed clock signal HSCLK. The outputs from the ring buffers 14*a* and 14*b* are respectively supplied to the 8-bit comparison circuits 15*a* and 15*b*. The bit values SP of the serial data are also supplied to the 8-bit comparison circuits 15*a* and 15*b* through the input terminal 11. Each of the 8-bit comparison circuits 15*a* and 15*b* compares one by one the bit values successively input from the ring buffer 14*a* or 14*b* and the bit values SP of the input serial data and outputs a coincidence signal having a logical value "1" to the OR circuit 16 if the groups of eight bits completely coincide with each other. The number of bits to be compared by the 8-bit comparison circuits 15*a* and 15*b* is the result of subtraction of the number of bits detected at a time by the logic circuits from the total number of bits of the patterns to be detected, which number is not limited to eight.

Figure 2:
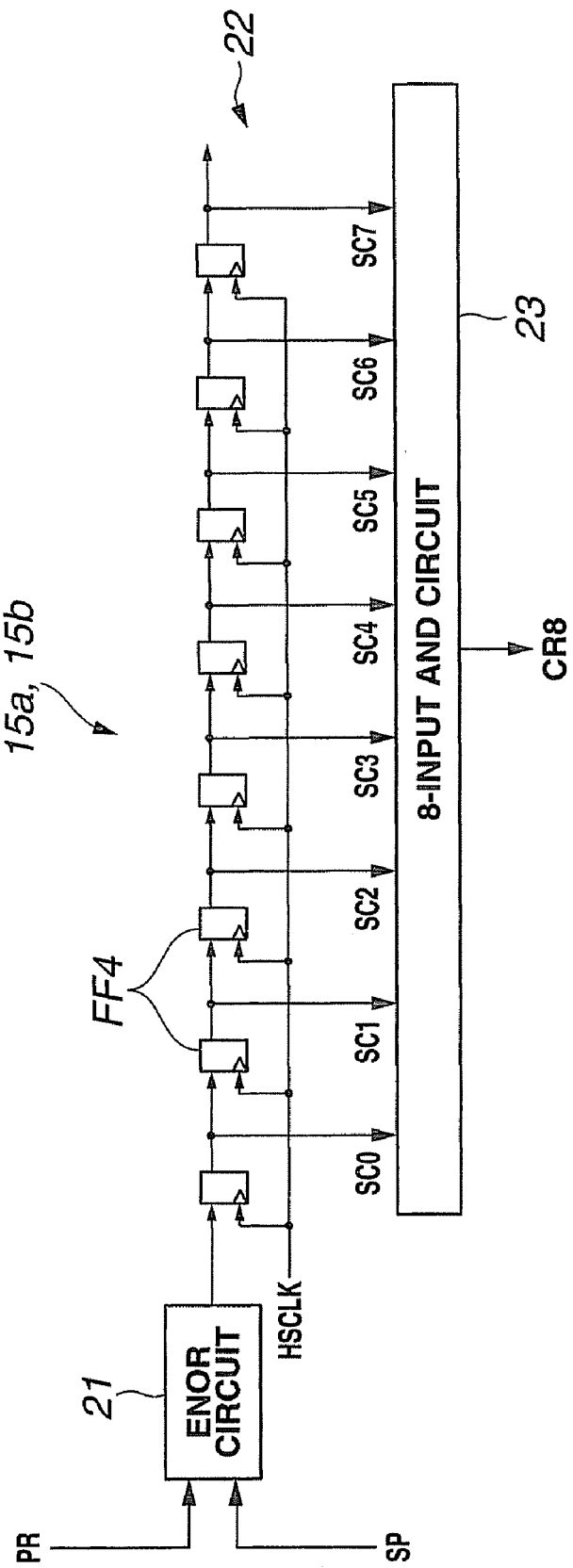
FIG. 2 is a circuit diagram showing an example of a specific configuration of 8-bit comparison circuits 15a and 15b shown in FIG. 1.

FIG. 2 is a circuit diagram showing an example of a specific configuration of the 8-bit comparison circuits 15*a* and 15*b* shown in FIG. 1. Since the 8-bit comparison circuits 15*a* and 15*b* are identical in configuration to each other, description will be made only of the configuration of one of the 8-bit comparison circuits 15*a* and 15*b*.

To ENOR circuits 21 of the 8-bit comparison circuits 15*a* and 15*b*, output bit values PR from the ring buffers 14*a* and 14*b* and the bit values SP of the input serial data are supplied. The ENOR circuit 21 outputs an inverted output from a 2-input exclusive OR operation to a shift register 22. The shift register 22 is configured by connecting flip-flops FF4 in series in a number of stages corresponding to the number of bits to be compared. The input to the preceding stage flip-flop FF4 is output to the subsequent stage flip-flop FF4 by the high-speed clock HSCLK. Outputs SC0 to SC7 from the flip-flops FF4 are also supplied to an 8-input AND circuit 23. The 8-input AND circuit 23 performs logical summation of the outputs from all the flip-flops FF4 of the shift register 22.

The ENOR circuit 21 outputs a logical value "1" to the shift register 22 when the output bit value PR from the ring buffer 14a or 14b and the bit value SP of the input serial data coincide with each other. The 8-input AND circuit 23 outputs "1" as a coincidence signal CR8 when the outputs SC0 to SC7 from all the flip-flops FF4 of the shift register 22 are "1". Consequently, each of the 8-bit comparison circuits 15a and 15b outputs the coincidence signal "1" when the serial data having the same pattern as the pattern of the bit values initially set in the ring buffer 14a or 14b is input.

The coincidence signals from the 8-bit comparison circuits 15a and 15b are supplied to the OR circuit 16. When at least one of the coincidence signals becomes a logical value "1", the OR circuit 16 outputs the coincidence signal CR8 to the clock divider 17.

The above-described shift register SR operates by the high-speed clock signal HSCLK. In the meantime, it is conceivable that, in the 8-bit comparison circuits 15a and 15b, there is also a need for comparison of bit values transferred by the high-speed clock signal HSCLK, which necessitates an operating speed higher than that of ordinary comparison circuits. In the 8-bit comparison circuits 15a and 15b in the present embodiment, therefore, comparison between the output bit value PR from the ring buffer and the bit value SP of the serial data is made by the ENOR circuit 21, the comparison results are transferred to and accumulated in the shift register 22, and logical summation of the accumulated comparison result is performed, thus enabling a high-speed comparison operation.

To the clock divider 17 provided as a timing determination section, the high-speed clock signal HSCLK is supplied from the input terminal 12. The clock divider 17 generates edges of low-speed clock signal LSCLK by using the coincidence signal CR8 "1" as a low-speed clock LSCLK generation start signal, and thereafter generates the low-speed clock signal LSCLK with the period according to the number of bits of the parallel bits by dividing the frequency of the high-speed clock signal HSCLK. The low-speed clock signal LSCLK from the clock divider 17 is supplied to the clock terminal of each flip-flop FF2 constituting the output section O.

A method of detecting a desired pattern at a time only by a logic circuit is conceivable. A method of detecting a desired pattern bit by bit by using only a ring buffer and a comparison circuit is also conceivable. In a case where pattern detection is performed only by a logic circuit, however, there is a possibility of a reduction in pattern detection speed due to the limit of the processing speed of the logic circuit. In a case where pattern detection is performed only by a ring buffer and a comparison circuit, the circuit scale is increased because the number of gates of shift registers constituting the ring buffer is comparatively large. In the present embodiment, therefore, each of patterns to be detected is divided into one or more first-group bits and other second-group bits; operations to detect the first-group bits are simultaneously performed in parallel with each other by using the logic circuits; and operations to detect the remaining bits one by one are performed by using the ring buffers are performed, thus enabling pattern detection at a comparatively high speed with a comparatively small circuit scale.

Figure 3:
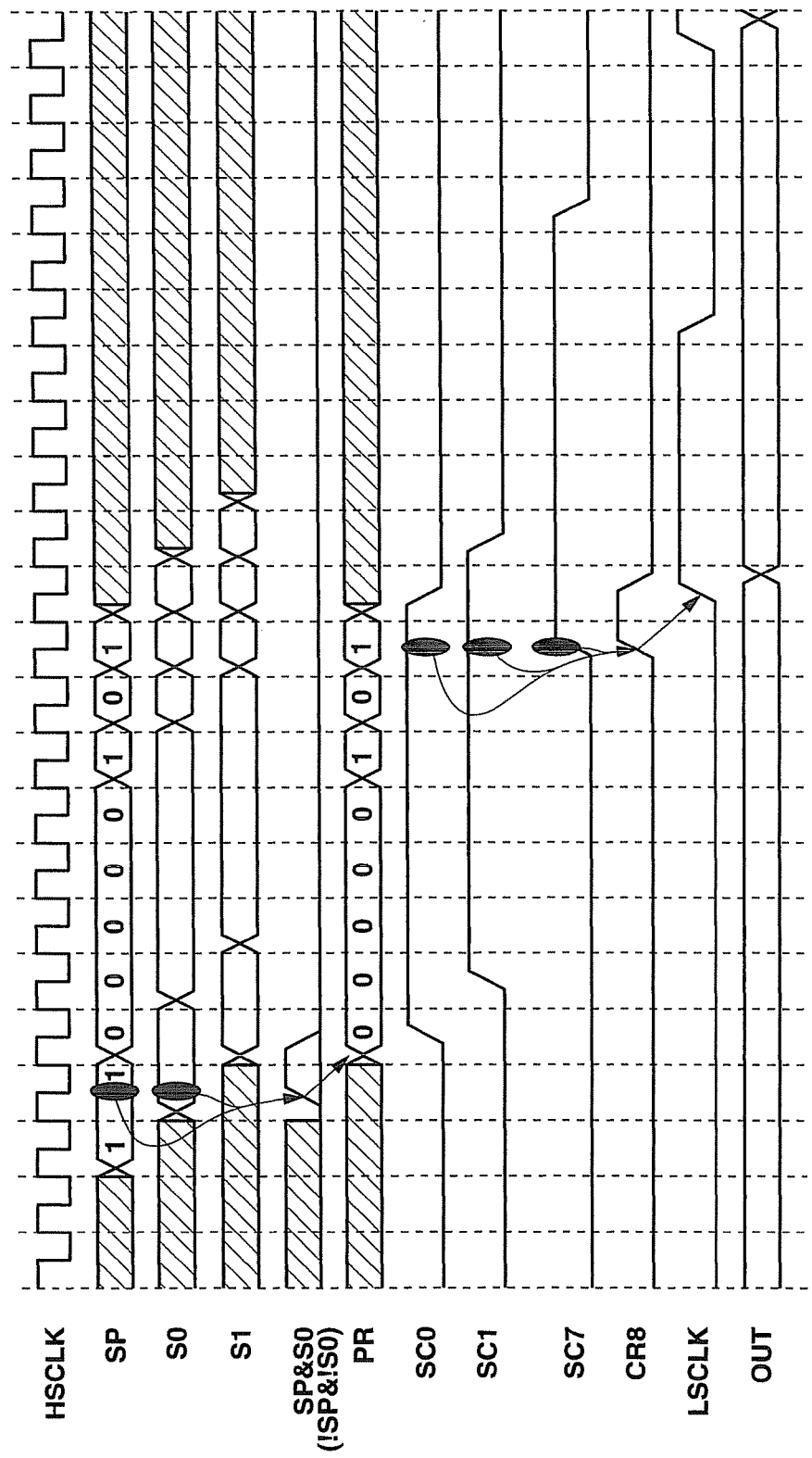
FIG. 3 is a timing chart for explaining the operation of the first embodiment.

The operation of the embodiment configured as described will be described with reference to the timing chart of FIG. 3. FIG. 3 shows the high-speed clock signal HSCLK, the bit value SP of input serial data, the bit values S0 and S1 of the outputs from the initial-stage and second-stage flip-flops FF1 of the shift register SR, the outputs from the AND circuit 13a and the NOR circuit 13b, the output PR from the ring buffers 14a and 14b, the outputs SC0, SC1, and SC7 of the flip-flops FF4 of the shift registers 22 in the 8-bit comparison circuits 15a and 15b, the coincidence signal CR8, the low-speed clock signal LSCLK, and output parallel data. The data values shown in FIG. 3 represent the bit values corresponding to the K28.5+ pattern.

FIG. 3 shows an example of a case where serial data containing K28.5± patterns as sync patterns is input and converted into 10-bit parallel data to be output.

The serial data is input to the input terminal 11. The serial data is supplied to the shift register SR. The shift register SR successively shifts the input serial data by using the high-speed clock signal HSCLK shown in FIG. 3.

The bit value SP of the serial data shown in FIG. 3 is also supplied to the AND circuit 13a and to the NOR circuit 13b. Hatched portions in FIG. 3 represent the data other than the sync pattern, while blank portions represent the bit values of the sync pattern.

It is assumed that a portion of the input serial data is consecutive bits "1". In this case, each of the values of the input bit value SP to the initial-stage flip-flop FF1 of the shift resister SR and the output bit value SO from this flip-flop is "1". Then, the output (SP and SO) from the AND circuit 13a is also a logical value "1", i.e., high level (hereinafter referred to as "H level"), as shown in FIG. 3. Since the output from the AND circuit 13a is a logical value "1", the ring buffer 14a is reset to the initial value and produces the output while circularly shifting the initial value by pulses of the high-speed clock signal HSCLK. That is, the output PR from the ring buffer 14a becomes "00000101" in correspondence with the pulses of the high-speed clock signal HSCLK as shown in FIG. 3.

The output PR from the ring buffer 14a is supplied to the 8-bit comparison circuit 15a. The bit value SP of the serial data is also supplied from the input terminal 11 to the 8-bit comparison circuit 15a. The ENOR circuit 21 of the 8-bit comparison circuit 15a compares the output PR from the ring buffer 14a and the bit value SP of the serial data from the bit next to the bit value "11" compared in the AND circuit 13a.

If the serial data presently input is the sync pattern (K28.5+ pattern), the output from the ENOR circuit 21 of the 8-bit comparison circuit 15a is "1" during the sync pattern input period. The output from the ENOR circuit 21 is successively shifted through the flip-flops FF4 of the shift register 22, and all the output SC0 to SC7 of the flip-flops FF4 become H level at a stage at which the result of comparison of the final bit of the K28.5+ pattern is output, as shown in FIG. 3. These outputs SC0 to SC7 are supplied to the 8-input AND circuit 23, and the coincidence signal CR8 at H level (logical value "1") is output from the 8-input AND circuit 23, as shown in FIG. 3.

The coincidence signal CR8 is supplied from the 8-bit comparison circuit 15a to the clock divider 17 via the OR circuit 16. The clock divider 17 outputs an edge of the low-speed clock signal LSCLK by timing corresponding to the pulse of the high-speed clock signal HSCLK subsequent to the input of the coincident signal CR8 at H level. The clock divider 17 thereafter generates and outputs the low-speed clock signal LSCLK with the predetermined period. Referring to FIG. 3, the low-speed clock signal LSCLK is obtained by dividing the frequency of the high-speed clock signal HSCLK by 10. The low-speed clock signal LSCLK from the clock divider 17 is supplied to the clock terminals of the flip-flops FF2 of the output section O.

The bit values held in the flip-flops FF1 of the shift register SR, i.e., the bit values of the 10-bit sync pattern K28.5+ in this case, are simultaneously output as parallel data from the flip-flops FF2 of the output section O by timing corresponding to the edge of the low-speed clock signal LSCLK.

The clock divider 17 thereafter generates the low-speed clock signal LSCLK obtained by dividing the frequency of the high-speed clock signal HSCLK by 10. The group of consecutive ten bits of data accumulated in the shift register SR is thereby output as parallel data from the output section O. Thus, the parallel data synchronized with the detected sync pattern can be obtained from the output section O.

The description has been made of a case where the K28.5+ pattern is input. In a case where the K28.5− pattern is input, coincidence/noncoincidence of the pattern is detected by the NOR circuit 13b, the ring buffer 14b and the 8-bit comparison circuit 15b. That is, the output from the NOR circuit 13b becomes "1" by the initial two bits "00" to reset the ring buffer 14b to the initial value. The output bit value PR from the ring buffer 14b and the bit value SP of the input serial data are compared by the 8-bit comparison circuit 15b, and the K28.5− pattern is detected. The other operations are the same as those in the case of detecting the K28.5+ pattern.

Thus, in the present embodiment, the desired pattern contained in the serial data is detected while the serial data is being transferred to the shift register to be converted into parallel data, timing of conversion to parallel data is determined on the basis of the detection result. That is, pattern detection is performed not by using a framer after parallel conversion but while taking in the serial data. The framer can be omitted. Thus, the need for comparison circuits and selecting circuits constituting the framer can be eliminated and the circuit area can be reduced. Also, the operating speed can be increased by reducing the fan-out. Also, there is no need for a bit-by-bit shift register operating by a low-speed clock signal, so that the latency can be reduced to improve the performance.

Furthermore, to detect each of desired patterns in the present embodiment, each pattern is divided into one or more first-group bits and other second-group bits, operations to detect the first-group bits are simultaneously performed in parallel with each other by using the logic circuits; and operations to detect the remaining bits one by one are performed by using the ring buffers are performed. The shift register constituting the ring buffer has a comparatively large number of gates. On the other hand, the number of gates of the logic circuit is comparatively small but the operating speed of the logic circuit is comparatively low. In the present embodiment, the numbers of bits to be respectively detected by the logic circuit and the ring buffer are suitably set to enable pattern detection at a comparatively high speed with a comparatively small circuit scale.

While the embodiment has been described with respect to detection of the K28.5± patterns for an example, the pattern detection method can be applied to any other patterns, for example, fixed patterns determined by a user. Also, while an example of detection in which the number of bits of patterns detected by each logic circuit is 2 has been described, it is apparent that a method may suffice in which three bits or more in a pattern to be detected are detected by a logic circuit and the other bits are detected one by one by a ring buffer and a comparison circuit. For example, in a case where three bits are detected by a logic circuit, the input bit SP and the output bit values S0 and S1 may be supplied to the logic circuit. Also, it is apparent that if there are three or more patterns to be detected, a certain numbers of logic circuits and a certain number of ring buffers and comparison circuits according to the number of patterns may be provided.

Second Embodiment

Figure 4:
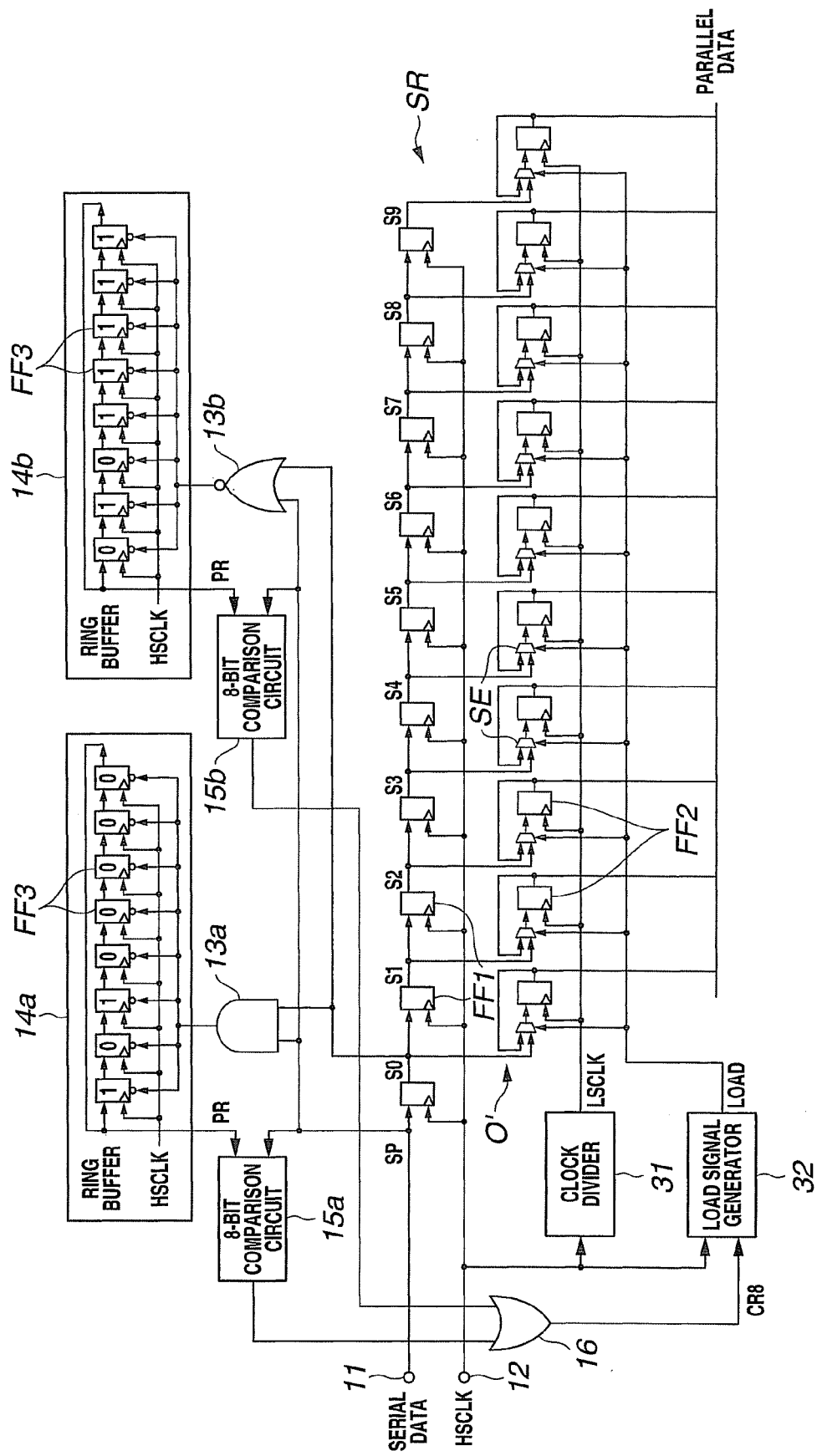
FIG. 4 is a circuit diagram showing a semiconductor integrated circuit device according to a second embodiment of the present invention.

FIG. 4 is a circuit diagram showing a semiconductor integrated circuit device according to a second embodiment of the present invention. In FIG. 4, components identical to those shown in FIG. 1 are indicated by the same reference characters. Description for the identical components will not be repeated.

The second embodiment differs from the first embodiment in that a clock divider 31 and an output section O' are adopted in place of the clock divider 17 and the output section O, and a load signal generator 32 is added. The output section O' differs from the output section O in that selecting circuits SE are provided in correspondence with the flip-flops FF2. A high-speed clock signal HSCLK is input to the clock divider 31. The clock divider 31 generates a low-speed clock signal LSCLK with a predetermined period by dividing the frequency of the high-speed clock signal HSCLK, and supplies the low-speed clock signal LSCLK to clock terminals of the flip-flops FF2 of the output section O'.

Outputs from the flip-flops FF1 of the shift register SR are supplied to input terminals of the flip-flops FF2 of the output section O' via the selecting circuits SE. The selecting circuits SE supply the outputs from the flip-flops FF1 of the shift register SR to the corresponding flip-flops FF2 of the output section O' by a LOAD signal from the load signal generator 32. The output section O' then outputs the outputs from the flip-flops FF1 of the shift register SR in parallel with each other with a low-speed clock pulse LSCLK period while being synchronized with the LOAD signal.

To the load signal generator 32, the high-speed clock signal HSCLK and the output from the OR circuit 16 are supplied. The load signal generator 32 generates the LOAD signal synchronized with the high-speed clock signal HSCLK by the coincidence signal supplied from the OR circuit 16 and having a logical value "1".

Figure 5:
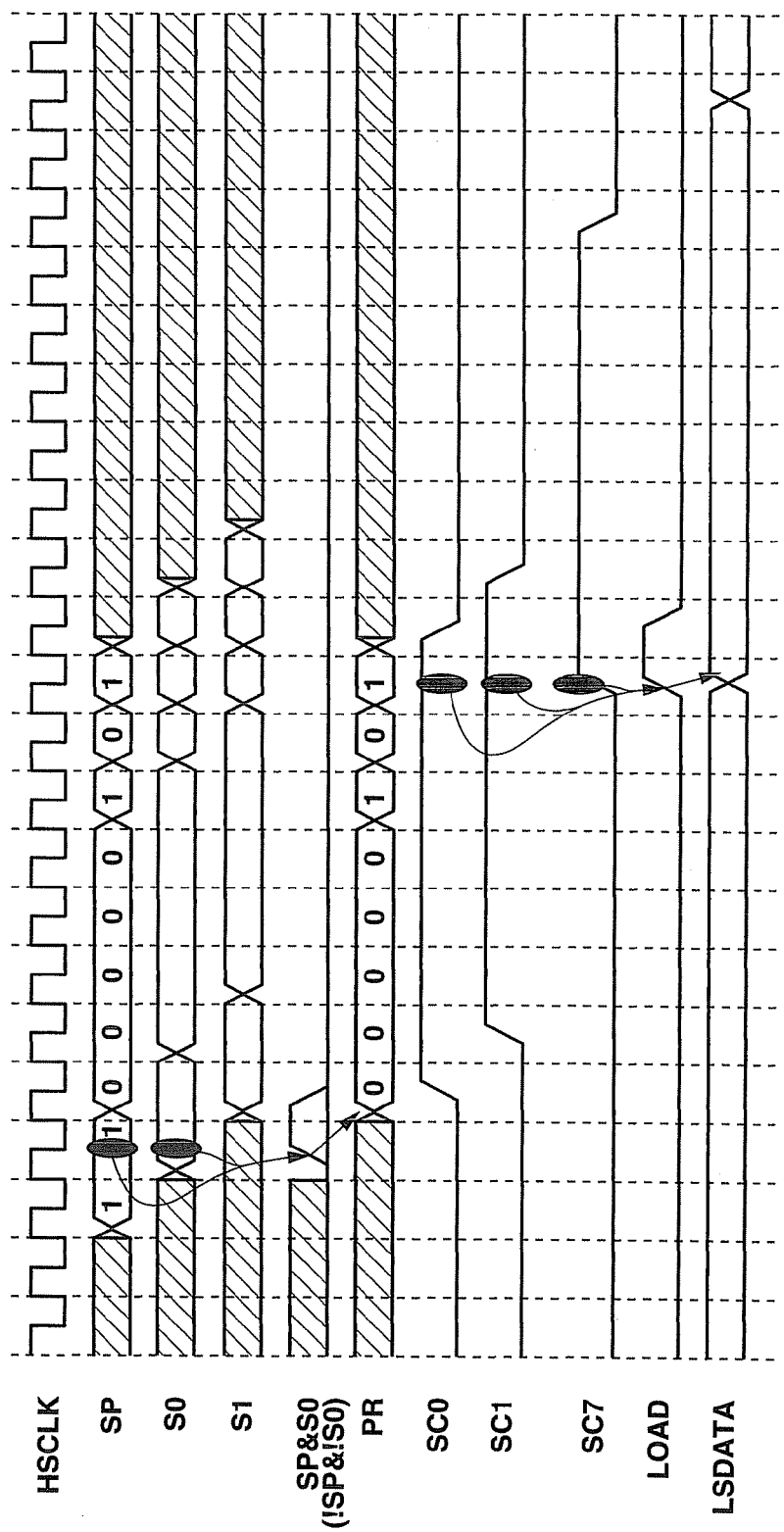
FIG. 5 is a timing chart for explaining the operation of the second embodiment.

The operation of the embodiment configured as described will be described with reference to the timing chart of FIG. 5. FIG. 5 shows the high-speed clock signal HSCLK, the bit value SP of input serial data, the bit values S0 and S1 of the outputs from the initial-stage and second-stage flip-flops FF1 of the shift register SR, the outputs from the AND circuit 13a and the NOR circuit 13b, the output PR from the ring buffers 14a and 14b, the outputs SC0, SC1, and SC7 of the flip-flops FF4 of the shift registers 22 in the 8-bit comparison circuits 15a and 15b, the LOAD signal, and output parallel data LSDATA. The data values shown in FIG. 5 represent the bit values corresponding to the K28.5+ pattern.

The operation of the pattern detection section 2 in the present embodiment is the same as that in the first embodiment. The coincidence signal having a logical value "1" is output from the OR circuit 16 in response to detection of the sync pattern contained in input serial data (see FIG. 5).

The load signal generator 32 generates the LOAD signal having a logical value "1" (H level) by the coincidence signal supplied from the OR circuit 16 and having a logical value "1". The LOAD signal is supplied to the selectors SE constituting the output section O'.

To the selectors SE forming stages in the output section O', the bit values of the serial data from the corresponding flip-flops FF1 of the shift register SR are supplied. The selectors SE select and output the outputs from the flip-flops FF2 before the H-level LOAD signal is input thereto. Only after receiving the input H-level LOAD signal, the selectors SE select and output the outputs from the corresponding flip-flops FF1 of the shift register SR. The flip-flops FF2 of the output section O' then output the bits values held in the shift register as parallel data LSDATA with a low-speed clock pulse LSCLK period while being synchronized with the H-level LOAD signal.

Thus, the present embodiment ensures the same effects as those of the first embodiment.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A semiconductor integrated circuit device comprising:
a shift register configured to successively take in and hold input serial data on the basis of a first clock signal;
at least one pattern detection section configured to detect at least one predetermined pattern contained in the serial data taken in the shift register; and
a timing determination section configured to, when the serial data held in the shift register is output by being converted into parallel data by using a second clock signal having a speed lower than that of the first clock signal, determine timing of conversion from the serial data to the parallel data on the basis of a result of detection performed by the at least one pattern detection section,
wherein the pattern detection section includes:
a logic circuit configured to divide the predetermined pattern in the serial data into one or more first-group bits and second-group bits, and to determine whether or not the serial data input to the shift register coincides with the one or more first-group bits; and
a determination section configured to determine whether or not the serial data input to the shift register coincides with the second-group bits, by checking the bits of the serial data one by one.

2. The semiconductor integrated circuit device according to claim 1, wherein the logic circuit is supplied with bit values corresponding to the one or more first-group bits from flip-flops in a plurality of stages constituting the shift register, and determines whether or not the serial data input to the shift register coincides with the one or more first-group bits.

3. The semiconductor integrated circuit device according to claim 1, wherein, when the logic circuit determines that the serial data input to the shift register coincides with the one or more first-group bits, the determination section determines whether or not the serial data input to the shift register coincides with the second-group bits, by taking in the serial data and comparing the serial data bit by bit.

4. The semiconductor integrated circuit device according to claim 1, wherein the determination section is constituted by a ring buffer and a bit comparison circuit.

5. The semiconductor integrated circuit device according to claim 4, wherein the ring buffer is configured to be reset by an output from the logic circuit to successively output the second-group bits.

6. The semiconductor integrated circuit device according to claim 4, wherein the bit comparison circuit includes:
an exclusive OR circuit configured to compare the input serial data and an output from the ring buffer bit by bit;
an accumulation section configured to accumulate results of comparison made by the exclusive OR circuit; and
a logical summation circuit configured to perform logical summation of the comparison results accumulated in the accumulation section to output a result of determination as to whether or not the input serial data coincides with the second-group bits.

7. A semiconductor integrated circuit device comprising:
a shift register configured to successively take in and hold input serial data on the basis of a first clock signal;
at least one pattern detection section configured to detect at least one predetermined pattern contained in the serial data taken in the shift register;
a timing determination section configured to, when the serial data held in the shift register is output by being converted into parallel data by using a second clock signal having a speed lower than that of the first clock signal, determine timing of conversion from the serial data to the parallel data on the basis of a result of detection performed by the at least one pattern detection section; and
an output section configured to output parallel data formed from the serial data held in the shift register by using the second clock signal from the timing determination section, wherein the timing determination section is configured to start generating the second clock signal by the conversion timing.

8. The semiconductor integrated circuit device according to claim 7, wherein the output section includes flip-flops in a plurality of stages which respectively hold outputs from the flip-flops in the plurality of stages constituting the shift register, and output the held outputs by timing based on the second clock signal.

9. A semiconductor integrated circuit device comprising:
a shift register configured to successively take in and hold input serial data on the basis of a first clock signal;
at least one pattern detection section configured to detect at least one predetermined pattern contained in the serial data taken in the shift register; and
a timing determination section configured to, when the serial data held in the shift register is output by being converted into parallel data by using a second clock signal having a speed lower than that of the first clock signal, determine timing of conversion from the serial data to the parallel data on the basis of a result of detection performed by the at least one pattern detection section,
wherein the timing determination section is configured to generate the second clock signal and to generate a load signal indicating the conversion timing, the semiconductor integrated circuit device further comprising an output section configured to take in the serial data held in the shift register by using the load signal from the timing determination section, and output the taken-in serial data by using the second clock signal from the timing determination section.

10. The semiconductor integrated circuit device according to claim 9, wherein the output section includes:
a plurality of selectors configured to respectively select and take in outputs from the flip-flops in the plurality of stages constituting the shift register by using the load signal; and
flip-flops in a plurality of stages configured to output, by timing based on the second clock signal, parallel data formed from the data respectively taken in by the plurality of selectors.

11. A pattern detection method comprising:
taking serial data in a shift register and successively transferring the serial data;
dividing a predetermined pattern in the serial data into one or more first-group bits and second-group bits and performing, when one or more bits of the serial data corresponding to the one or more first-group bits are taken in the shift register, a logical operation on values of the bits taken in to determine whether or not the serial data input to the shift register coincides with the one or more first-group bits; and determining, when one or more bits of the serial data corresponding to the one or more first-group bits are taken in the shift register, whether or not the serial data input to the shift register coincides with the one or more first-group bits by performing a logical operation on values of the bits taken in the shift register, and detecting, if it is determined by the logical operation that the serial data input to the shift register coincides with the one or more first- group bits, the predetermined pattern in the serial data by making determination on a bit-by-bit basis, each time a bit of the serial data is taken in the shift register, as to whether or not the value of the bit taken in coincides with the corresponding one of the second-group bits of the predetermined pattern.

12. The pattern detection method according to claim 11, wherein transfer of the serial data in the shift register and determination on a bit-by-bit basis with respect to the second-group bits are performed by using a common clock signal.

13. A serial-parallel conversion method comprising:

taking serial data in a shift register and successively transferring the serial data by using a first clock signal;

detecting a predetermined pattern contained in the serial data in the course of transfer of the serial data; and converting, when the predetermined pattern is detected, the serial data held in the shift register into parallel data by using a second clock signal having a speed lower than that of the first clock signal and outputting the parallel data, wherein the determination of the predetermined pattern is made by dividing the predetermined pattern in the serial data into one or more first-group bits and second-group bits, by determining, by a logical operation, whether or not the serial data input to the shift register coincides with the one or more first-group bits, and by determining whether or not the serial data input to the shift register coincides with the second-group bits, by using the first clock signal and checking the bits of the serial data one by one.

14. The serial-parallel conversion method according to claim 13, wherein the determination as to whether or not the serial data input to the shift register coincides with the one or more first-group bits is made by obtaining bits values corresponding to the one or more first-group bits from flip-flops in a plurality of stages constituting the shift register, and by performing a logical operation on the obtained bit values.

15. The serial-parallel conversion method according to claim 13, wherein the determination as to whether or not the input serial data coincides with the second-group bits is made by, when it is determined that the serial data input to the shift register coincides with the one or more first-group bits, taking in the serial data subsequent to the one or more first-group bits and comparing the serial data bit by bit.

16. The serial-parallel conversion method according to claim 15, wherein the determination as to whether or not the input serial data coincides with the second-group bits is made by performing an exclusive OR operation on the input serial data and the second- group bits bit by bit, by accumulating results of comparison based on the exclusive OR operation, and by performing a logical summation of the accumulated comparison results.

17. A serial-parallel conversion method comprising:

taking serial data in a shift register and successively transferring the serial data by using a first clock signal;

detecting a predetermined pattern contained in the serial data in the course of transfer of the serial data; and converting, when the predetermined pattern is detected, the serial data held in the shift register into parallel data by using a second clock signal having a speed lower than that of the first clock signal and outputting the parallel data, wherein output of the parallel data is performed by supplying outputs from flip-flops in a plurality of stages constituting the shift register to flip-flops in a plurality of stages constituting an output section by using a load signal generated at a time at which the predetermined pattern is detected, and by outputting parallel data formed from the serial data held in the flip-flops in the plurality of stages constituting the output section by using the second clock signal.

* * * * *